(12) United States Patent
Cheng et al.

(10) Patent No.: US 7,808,753 B2
(45) Date of Patent: Oct. 5, 2010

(54) SYSTEM AND METHOD FOR MONITORING NEGATIVE BIAS IN INTEGRATED CIRCUITS

(75) Inventors: Chi-Ting Cheng, Taichung (TW); Chen-Hui Hsieh, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 812 days.

(21) Appl. No.: 11/712,263

(22) Filed: Feb. 27, 2007

(65) Prior Publication Data

US 2008/0203996 A1    Aug. 28, 2008

(51) Int. Cl.
*H02H 9/00* (2006.01)

(52) U.S. Cl. .................................................. 361/56

(58) Field of Classification Search .................... 361/56
See application file for complete search history.

(56) References Cited

U.S. PATENT DOCUMENTS 6,556,398 B1 *    4/2003   Chen ........................... 361/56

* cited by examiner

*Primary Examiner*—Stephen W Jackson
(74) *Attorney, Agent, or Firm*—K&L Gates LLP

(57) ABSTRACT

A bias voltage monitoring circuit is disclosed which comprises a first device coupled between a positive high voltage power supply (VDD) and a first node, a second device coupled between the first node and a second node where the bias voltage is applied, and a pad coupled to the first node, wherein the first and second devices form a voltage divider and a voltage measured at the pad reflects the bias voltage, and the first device and the second device is so chosen that a voltage at the first node is always positive for a given range of the bias voltage.

14 Claims, 2 Drawing Sheets

SYSTEM AND METHOD FOR MONITORING NEGATIVE BIAS IN INTEGRATED CIRCUITS

BACKGROUND

The present invention relates generally to integrated circuit (IC) designs, and more particularly to a bias monitoring circuit design.

In a complicated IC, such as system-on-chip (SOC), internal bias voltage often needs to be monitored through an external pad. FIG. 1 is a schematic diagram illustrating a conventional bias voltage monitoring circuit 100, which comprises a pad 102 coupled to a node 106 where the bias voltage is applied. Then the bias voltage level may be monitored at the pad 102. As an external pad on an IC package, the pad 102 needs to be protected by an ESD protection circuit 110, which comprises a resistor 113, a P-type metal-oxide-semiconductor (PMOS) transistor 122, an N-type metal-oxide-semiconductor (NMOS) transistor 124 and diodes 132 and 134. The resistor 113 is coupled between the node 106 and the pad 102. The PMOS transistor 122 has a gate and source coupled to a positive high voltage supply (VDD) and a drain coupled to the pad 102. The NMOS transistor 124 has a gate and source coupled to a complementary low voltage supply, or ground (GND) and a drain coupled to the pad 102. The transistors 122 and 124 essentially serve as reverse biased transistor diodes. The diodes 132 and 134 may be formed by PN junctions. The diode 132, coupled between the VDD and the pad 102, is also reversely biased, so is the diode 134, which is coupled between the GND and the pad 102. These reverse biased ESD protection devices 122, 124, 132 and 134 are supposed to be off during normal operations, and discharge current only during an ESD event. However, if the bias node 106 turned to a negative voltage lower than the GND, then both the NMOS transistor 124 and the diode 134 may be turned on and causing current leakages through the devices 124 and 134.

As such, what is desired is a bias monitoring circuit that can monitor both positive and negative biases without causing leakage current.

SUMMARY

In view of the foregoing, the present invention provides a bias voltage monitoring circuit, which comprises a first device coupled between a positive high voltage power supply (VDD) and a first node, a second device coupled between the first node and a second node where the bias voltage is applied, and a pad coupled to the first node, wherein the first and second devices form a voltage divider and a voltage measured at the pad reflects the bias voltage, and the first device and the second device is so chosen that a voltage at the first node is always positive for a given range of the bias voltage.

The construction and method of operation of the invention, however, together with additional objects and advantages thereof will be best understood from the following description of specific embodiments when read in connection with the accompanying drawings.

DESCRIPTION

The following will provide a detailed description of a system and method for constructing a bias voltage monitoring circuit.

Figure 2:
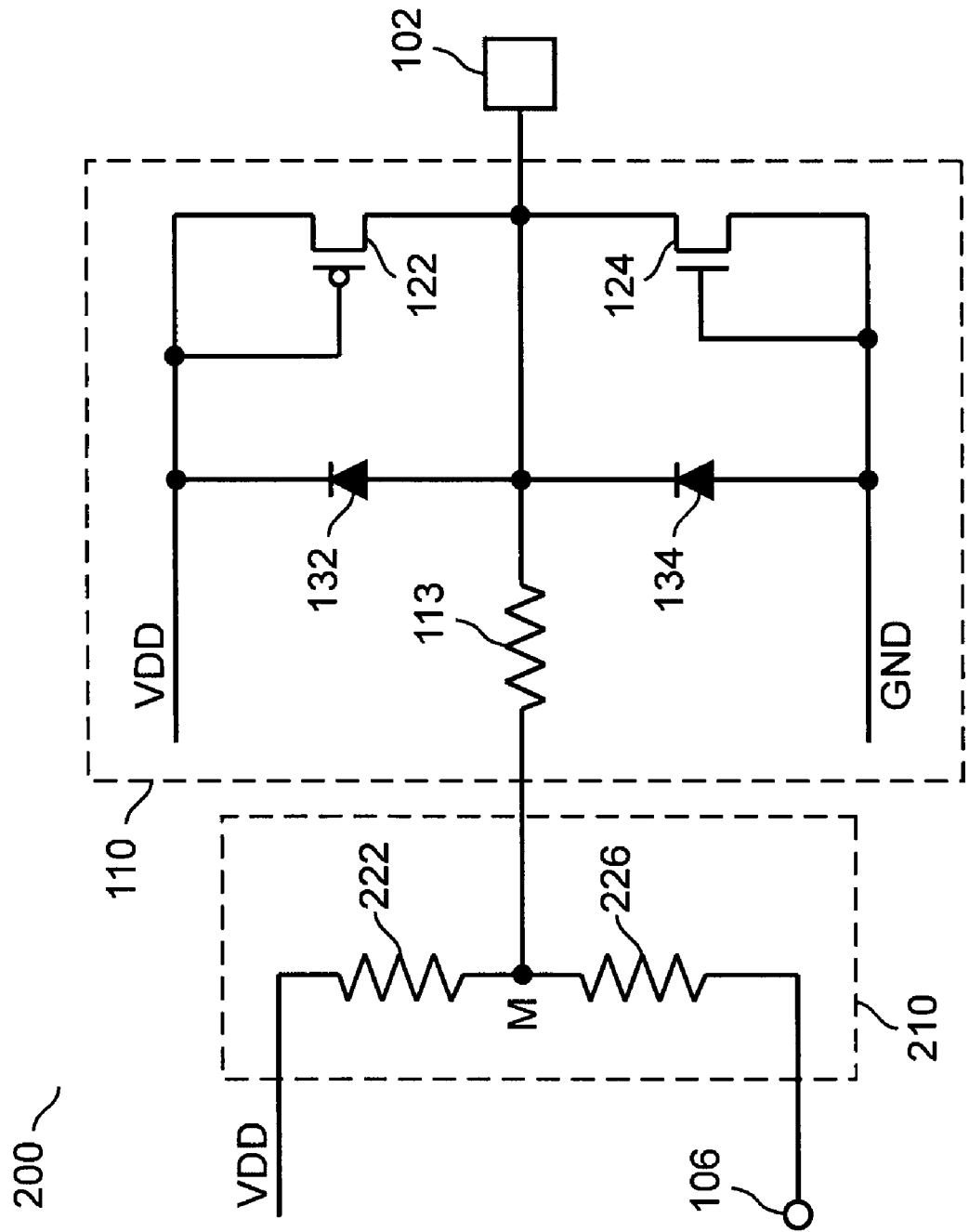
FIG. 2 is a schematic diagram illustrating a bias voltage monitoring circuit with a voltage divider according to one embodiment of the present invention.

FIG. 2 is a schematic diagram illustrating a bias voltage monitoring circuit 200 with a voltage divider 210 according to one embodiment of the present invention. The voltage divider 210 comprises serially connected resistors 222 and 226. The resistor 222 has two terminals coupled to a positive high voltage power supply (VDD) and a node M, respectively. The resistor 226 has two terminals coupled to the node M and node 106, respectively. The node 106 is where the monitored bias voltage is applied. A resistance ratio between the resistors 222 and 226 determines a voltage level at the node M. Assuming all the current flowing through the resistor 222 also flows through the resistor 226, then the voltage at the node M can be expressed as:

$$V\_M=(VDD*R2+V\_B*R1)/(R1+R2) \quad (Eq. 1)$$

where, V_M is the voltage at the node M, V_B is the bias voltage at the node 106, R1 is a resistance of the resistor 222, and R2 is a resistance of the resistor 226. When R1 and R2 are properly chosen, the V_M can always be positive for a given range of V_B.

Figure 1A:
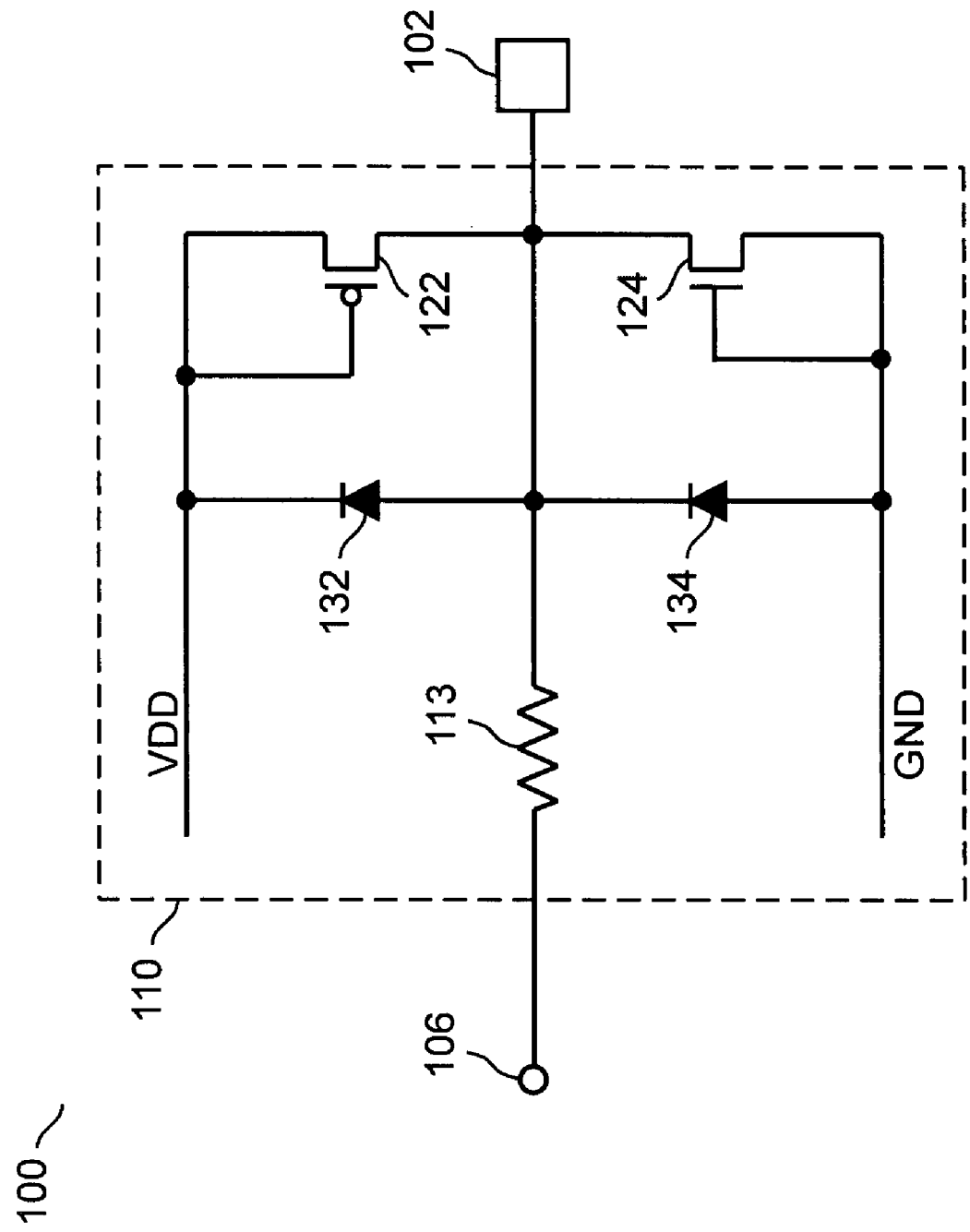
FIG. 1 is a schematic diagram illustrating a conventional bias voltage monitoring circuit.

Referring to FIG. 2, the node M is coupled to the pad 102 through the ESD protection circuit 110, which, as illustrated in FIG. 1, comprises the resistor 113, the diodes 132 and 134, the PMOS transistor 122 and the NMOS transistor 124. The resistor 113 is coupled between the node M and the pad 102. Since the voltage at the node M, or V_M, is always positive through properly choosing the right values of R1 and R2, then all the ESD devices 122, 124, 132 and 134 are off during non ESD operations. In a voltage measurement, in which the pad 102 draws negligible amount of current, a voltage at pad 102, or V_meas, approximately equals to the voltage at the node M, or V_M. Then, Eq. 1 becomes $$V\_B=V\_meas*(R1+R2)/R1-V\_DD*(R2/R1) \quad (Eq. 2)$$

Although the supply voltage of the voltage divider 210 is the same VDD used by the ESD circuit 110 as shown in FIG. 2, one having skills in the art would recognize a supply voltage other than VDD may be used by the voltage divider 210. For a different VDD value, choosing a different R1 and R2 value, V_M can still be maintained at a positive range.

Although a resistive voltage divider 210, formed by the resistors 222 and 226, is described as the embodiment of the present invention, one having skills in the art would realize that other kinds of devices, such as forward biased transistors, may also be used to form the voltage divider 210. However, the resistors 222 and 226 provide a linear relationship between the voltage at the pad 102, or V_meas, and the bias voltage at the node 106, or V_B, as shown in Eq. 2. Another advantage of using the resistive divider 210 is that an accuracy of the voltage measurement is less affected by process variations. Since the resistance ratio of the resistors 222 and 226 mostly affects the relationship of V_B and V_meas, or the accuracy of the measurement, as shown in Eq. 2, any process variations would affect the resistors 222 and 226 in the same direction, and keep the ratio unchanged.

In summary, the present invention provides a way to monitor a bias voltage in an IC. Even when the bias voltage is a negative voltage, an ESD protection circuit associated with the monitoring pad will not be affected, e.g. yielding leakage current or failing its protection abilities.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A bias voltage monitoring system, the system comprising:
    a first device coupled between a positive high voltage power supply (VDD) and a first node;
    a second device coupled between the first node and a second node where the bias voltage is applied;
    a pad coupled to the first node; and
    an electrostatic discharge (ESD) circuit coupled to the pad, wherein the first and second devices form a voltage divider and a voltage measured at the pad reflects the bias voltage.

2. The system of claim 1, wherein the first and second devices are linear devices.

3. The system of claim 1, wherein the first and second devices are resistive devices.

4. The system of claim 1, wherein the ESD circuit comprises a diode with an anode coupled to a ground and a cathode coupled to the pad.

5. The system of claim 1, wherein the ESD circuit comprises a NMOS transistor with a drain coupled to the pad and a source and gate coupled to a ground.

6. A bias voltage monitoring system, the system comprising:
    a first linear device coupled between a positive high voltage power supply (VDD) and a first node;
    a second linear device coupled between the first node and a second node where the bias voltage is applied;
    a pad coupled to the first node; and
    an electrostatic discharge (ESD) circuit coupled to the pad, wherein the first and second linear devices form a voltage divider and a voltage measured at the pad reflects the bias voltage.

7. The system of claim 6, wherein the first and second linear devices are resistive devices.

8. The system of claim 6, wherein the ESD circuit comprises a diode with an anode coupled to a ground and a cathode coupled to the pad.

9. The system of claim 6, wherein the ESD circuit comprises a NMOS transistor with a drain coupled to the pad and a source and gate coupled to a ground.

10. A method for measuring a bias voltage in an integrated circuit, the method comprising:
    providing a voltage divider coupled between a positive high voltage power supply (VDD) and a first node where the bias voltage is applied, wherein the voltage divider has a second node with a voltage that is higher than as well as follows the bias voltage;
    providing a pad coupled to the second node; and
    an electrostatic discharge (ESD) protection circuit coupled to the pad,
    wherein the bias voltage is indirectly measured at the pad.

11. The method of claim 10, wherein the providing the voltage divider comprises:
    providing a first linear device coupled between the VDD and the second node; and
    providing a second linear device coupled between the first and second nodes.

12. The method of claim 11, wherein the first and second linear devices are resistive devices.

13. The method of claim 10, wherein the providing the ESD protection circuit comprises providing a reverse biased diode between the pad and a ground.

14. The method of claim 10, wherein the providing the ESD protection circuit comprises providing a gate-grounded NMOS transistor the pad and a ground.

* * * * *